United States Patent
Hairston

(10) Patent No.: US 11,350,054 B2
(45) Date of Patent: May 31, 2022

(54) DUAL GAIN IMAGING DIGITAL PIXEL MEMORY

(71) Applicant: BAE SYSTEMS Information and Electronic Systems Integration Inc., Nashua, NH (US)

(72) Inventor: Allen W. Hairston, Andover, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 127 days.

(21) Appl. No.: 16/783,492

(22) Filed: Feb. 6, 2020

(65) Prior Publication Data

US 2020/0177833 A1 Jun. 4, 2020

Related U.S. Application Data

(63) Continuation-in-part of application No. 15/985,237, filed on May 21, 2018, now Pat. No. 10,992,895.

(51) Int. Cl.
| | |
|---|---|
| *G01J 5/00* | (2022.01) |
| *H04N 5/378* | (2011.01) |
| *G11C 11/417* | (2006.01) |
| *G05F 3/20* | (2006.01) |
| *H01L 27/146* | (2006.01) |

(52) U.S. Cl.
CPC .............. *H04N 5/378* (2013.01); *G05F 3/205* (2013.01); *G11C 11/417* (2013.01); *H01L 27/14609* (2013.01)

(58) Field of Classification Search
CPC .......... H04N 5/378; H04N 5/33; H04N 5/347; H04N 5/37455; H04N 5/37452; G11C 11/417; G05F 3/205; H01L 27/14609
See application file for complete search history.

(56) References Cited

U.S. PATENT DOCUMENTS

| | | |
|---|---|---|
| 6,249,002 B1 | 6/2001 | Butler |
| 6,274,869 B1 | 8/2001 | Butler |
| 6,433,333 B1 | 8/2002 | Howard |
| 6,791,610 B1 | 9/2004 | Butler |
| 6,891,160 B2 | 5/2005 | Kaufman |
| 8,350,208 B1 * | 1/2013 | Zhang ............... H01L 27/14647 250/214.1 |

(Continued)

FOREIGN PATENT DOCUMENTS

| | | |
|---|---|---|
| EP | 0870330 A1 | 10/1998 |
| WO | 2015/084991 A1 | 6/2015 |

OTHER PUBLICATIONS

International Search Report and Written Opinion, PCT/US19/28682, dated Mar. 5, 2020, 14 pages.

(Continued)

*Primary Examiner* — Kiho Kim
(74) *Attorney, Agent, or Firm* — Maine Cernota & Rardin; Gary McFaline

(57) ABSTRACT

Techniques and architectures for simultaneous readout and integration of image data from pixels while increasing their sensitivity and reducing required data rates for moving information off of the chip using pixels configured to conduct Analog-to-Digital Conversions (ADCs) of image data, wherein each pixel operates in a rolling Integrate While Read (IWR) mode using SRAM in place of traditional latches for in-pixel storage.

19 Claims, 7 Drawing Sheets

(56) References Cited

U.S. PATENT DOCUMENTS

| | | |
|---|---|---|
| 9,787,923 B2 | 10/2017 | Petilli |
| 9,918,023 B2 | 3/2018 | Simolon |
| 2002/0022938 A1 | 2/2002 | Butler |
| 2002/0190208 A1 | 12/2002 | Wood |
| 2003/0213910 A1 | 11/2003 | Anderson |
| 2005/0258367 A1 | 11/2005 | Anderson |
| 2006/0131484 A1 | 6/2006 | Peting |
| 2007/0029484 A1 | 2/2007 | Anderson |
| 2012/0043464 A1 | 2/2012 | Kryskowski |
| 2013/0278804 A1* | 10/2013 | Denham ............... H04N 5/347 348/302 |
| 2014/0138543 A1 | 5/2014 | LaVeigne |
| 2015/0009386 A1 | 1/2015 | Komaba |
| 2015/0085134 A1 | 3/2015 | Novotny |
| 2015/0188628 A1 | 7/2015 | Chalfant, III |
| 2015/0215553 A1 | 7/2015 | Hidalgo |
| 2015/0288909 A1 | 10/2015 | Komaba |
| 2016/0104696 A1 | 4/2016 | LaVeigne |
| 2016/0204866 A1 | 7/2016 | Boroson |
| 2017/0041571 A1 | 2/2017 | Tyrrell |
| 2017/0054922 A1 | 2/2017 | Novotny |
| 2018/0351653 A1 | 12/2018 | Bortz |

OTHER PUBLICATIONS

Office Action for U.S. Appl. No. 15/985,237, dated Jun. 30, 2020, 20 Pages.
Office Action for U.S. Appl. No. 15/985,237, dated Dec. 30, 2020, 17 Pages.
International Search Report, PCT/US19/28682, dated Mar. 5, 2020, 14 pages.
EP Search Report, EP 19851365.7, dated Feb. 25, 2022, 9 pages.

\* cited by examiner

DUAL GAIN IMAGING DIGITAL PIXEL MEMORY

RELATED APPLICATIONS

This application is a continuation in part of U.S. patent application Ser. No. 15/985,237 having a filing date of May 21, 2018. This application is herein incorporated by reference in its entirety for all purposes.

STATEMENT OF GOVERNMENT INTEREST

This invention was made with government support under contract no. W909MY-18-9-0001 awarded by the United States Army. The government has certain rights in the invention.

FIELD OF THE DISCLOSURE

The following disclosure relates generally to imaging and, more specifically, to pixels that allow for simultaneous readout and integration.

BACKGROUND

Digital detection of visual and infrared (IR) images is a very widely used technology, having applications ranging from consumer-oriented cameras and video apparatuses to law enforcement and military equipment. For virtually all of these applications, there is a growing demand for higher image pixel counts, higher pixel density, increased sensitivity, improved dynamic range, lower power consumption, faster image processing, and the ability to switch between modes offering different balances of these characteristics, dependent on the requirements present at a given time.

At the heart of all digital imaging systems, which may be referred to generally as Solid State Area Array Imaging Devices (SSAAIDs), is the Focal Plane Array ("FPA"), which is a two-dimensional array of elements upon which an image is focused, whereby each of the FPA elements or "pixels" develops an analog output "signal charge" that is proportional to the intensity of the electromagnetic radiation that is impinging on it after a given interval of time. This signal charge can then be stored, measured, and used to produce an image.

The storage and measurement of the electromagnetic radiation that has impinged on a pixel over a given amount of time is accomplished using a Read-Out Integrated Circuit (ROIC). Some existing digital pixel Read-Out Integrated Circuits (ROICs), such as that shown in FIG. 1, use counter latches for both storage and readout of data, preventing simultaneous readout and integration. This reduces the time available for both integration, reducing sensitivity, and for readout, increasing required data rates for moving information off of the chip.

Furthermore, some existing digital pixel ROICs use counter latches for coarse conversion only. Coarse conversion only limits dynamic range and resolution while increasing power. Adding a separate fine conversion counter would allow counter latches to be used for both coarse and fine conversions, but would also increase pixel size and/or number of ROIC layers using traditional counter latches. While these issues might be mitigated through the use of stacked digital layers, this would result in significantly more expensive fabrication and assembly processes. Moving to a smaller geometry (e.g. a 14 nm process) might mitigate such issues, but would also be very expensive.

What is needed, therefore, are systems and methods that allow simultaneous readout and integration of image data from pixels while increasing their sensitivity and reducing required data rates for moving information off of the chip.

SUMMARY

An example embodiment of the present disclosure provides a system including a plurality of pixels, each pixel being configured to conduct an Analog-to-Digital Conversion (ADC) of image data wherein each pixel operates in a rolling Integrate While Read (IWR) mode. Through the use of SRAM in place of traditional counter latches, these pixels are able to incorporate coarse and fine conversion counters into each pixel or group of pixels without increasing the size thereof, allowing counter latches to be used for both coarse and fine conversions.

One embodiment of the present disclosure provides an imaging apparatus comprising: a focal plane array, the focal plan array comprising: a plurality of pixels, wherein the pixels are arranged into groups of equal numbers of one or more pixels, each pixel comprising: a photodetector configured to receive electromagnetic energy; and a readout integrated circuit comprising an analog portion and a digital portion, the digital portion comprising at least one latch comprising random access memory, wherein the readout integrated circuit is configured to perform analog to digital conversion.

Another embodiment of the present disclosure provides such an imaging apparatus wherein the random access memory is static random access memory.

A further embodiment of the present disclosure provides such an imaging apparatus wherein the random access memory comprises at least one foundry-generated memory cell, static random access memory, or dynamic random access memory, and wherein the memory cell is configured for dedicated access.

Yet another embodiment of the present disclosure provides such an imaging apparatus wherein the static random access memory is configured to act as a digital sample and hold.

A yet further embodiment of the present disclosure provides such an imaging apparatus wherein the readout integrated circuit of each group of pixels further comprises: a binning selection switch connected between a first output of the photodetector and the digital portion of the readout integrated circuit; a readout integration capacitor configured to convert charge produced by the photodetector to a voltage, wherein the readout integration capacitor is in electrical communication with a VRSI reference or ramp; a comparator with two inputs, a threshold voltage input and a second input in electrical communication with the readout integration capacitor; an enable count latch in electrical communication with an output of the comparator and in further electrical communication with a clock that itself is in switched electrical communication with a counter or latch via a readout connection, the enable count latch also being in switched electrical communication with the counter or latch; a latch module connected to the counter or latch; a select latch write in operative communication with the latch module; a select latch read in operative communication with the latch module; a counter reset in operative communication with the counter or latch; at least two direct injection integration bias transistors disposed between the comparator and the photodetector; a stop integration switch configured for residue conversion and disposed between the comparator and the photodetector; an event detect connected to the comparator output; and a reset clock or event bias disposed between the comparator output and the second input of the comparator.

Still another embodiment of the present disclosure provides such an imaging apparatus wherein the readout integrated circuit is configured to perform in-pixel single slope analog to digital conversion.

A still further embodiment of the present disclosure provides such an imaging apparatus wherein the readout integrated circuit is configured to perform in-pixel two-stage analog to digital conversion.

Even another embodiment of the present disclosure provides such an imaging apparatus wherein the photodetector is a two-color photodetector.

An even further embodiment of the present disclosure provides such an imaging apparatus wherein the readout integrated circuit further comprises a select detector configured to allow parallel, two-color conversion.

A still even another embodiment of the present disclosure provides such an imaging apparatus wherein the readout integrated circuit further comprises at least two direct injection integration bias transistors.

A still even further the at least two direct injection integration bias transistors are one NFET and one PFET.

Still yet another embodiment of the present disclosure provides such an imaging apparatus wherein the latch is configured to allow one counter to be shared among a group of pixels.

A still yet further embodiment of the present disclosure provides such an imaging apparatus wherein the latch is configured to store coarse count data corresponding to a previously-captured subframe from at least one photodetector while a different photodetector is using the counter to count a subframe in the process of being captured and then, for each photodetector, to load a counter value stored in the latch for that detector and the count data for the next detector from previous subframes to continue the integration for that detector in the next subframe.

Even yet another embodiment of the present disclosure provides such an imaging apparatus wherein the latch comprises a plurality of latches, each latch having the same number of bits as the counter shared among the group of pixels.

Still even yet another embodiment of the present disclosure provides such an imaging apparatus wherein the number of latches is equal to the number of pixels in the group of pixels.

One embodiment of the present disclosure provides an imaging apparatus comprising: a plurality of groups of pixels, each group comprising at least one pixel; wherein each pixel comprises a photodetector, wherein each pixel in a group of pixels shares a plurality of components with other pixels in the group of pixels, wherein each of the groups of pixels is configured to perform in-pixel analog to digital conversion of electromagnetic energy collected by the photodetectors within that group of pixels using circuitry common to the group of pixels, and wherein each of the groups of pixels comprises random access memory.

Another embodiment of the present disclosure provides such an imaging apparatus wherein the static random access memory is configured to act as a digital sample and hold.

A further embodiment of the present disclosure provides such an imaging apparatus wherein the circuitry common to the group of pixels comprises a readout integrated circuit.

Yet another embodiment of the present disclosure provides such an imaging apparatus wherein the readout integrated circuit comprises at least one latch, the latch being in operative communication with at least one select latch write and at least one select latch read, and wherein the latch module comprises static random access memory and is in operative communication with a counter.

A yet further embodiment of the present disclosure provides such an imaging apparatus wherein the readout integrated circuit is configured to perform in-pixel single slope ADC.

Implementations of the techniques discussed above may include a method or process, a system or apparatus, a kit, or computer software stored on a computer-accessible medium. The details or one or more implementations are set forth in the accompanying drawings and the description below. Other features will be apparent from the description and drawings, and form the claims.

The features and advantages described herein are not all-inclusive and, in particular, many additional features and advantages will be apparent to one of ordinary skill in the art in view of the drawings, specification, and claims. Moreover, it should be noted that the language used in the specification has been selected principally for readability and instructional purposes and not to limit the scope of the inventive subject matter.

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

As a preliminary matter, a microbolometer 312, as used herein, is a specific type of bolometer, an electrical instrument for measuring radiant energy that is suitable for use as a detector in thermal cameras. In a typical microbolometer, infrared radiation with wavelengths between 7.5-14 μm strikes a detector material, heating it. This change in temperature changes the sensor's electrical resistance in a predictable fashion, allowing for the intensity of incident radiation in this range during a given time to be inferred based on the change in electrical resistance over this same period.

Furthermore, Static random access memory (static RAM or SRAM) is a type of semiconductor random access memory (RAM) that uses bistable latching circuitry (flip-flops) to store each bit. SRAM is designed for incorporation into memory arrays and provides high storage density.

SRAM, or foundry library SRAM, is typically developed by the foundries responsible for creating integrated circuits without adhering to their own internal rules regarding the manufacture of such integrated circuits (e.g. traces must be a certain distance apart). The foundries use such 'rules' to ease the production of new integrated circuits, however, since these rules need to be generic enough to cover a wide range of geometries and situations, in some cases they are ignored. When the integrated circuit developed outside of these constraints and testing is successful, performance is generally greater or size smaller, relative to integrated circuits developed in accordance with these rules. SRAM designs are typically supplied to users of the foundry as completed circuits with a large array of SRAM latches integrated with latch reading and writing circuits to interface with other higher level digital components.

In embodiments of the present disclosure, foundry latches are used to create small SRAM arrays within each pixel with custom read and write circuits, as opposed to using the foundry cells in standard circuits' blocks generated by a foundry SRAM compiler.

Figure 1:
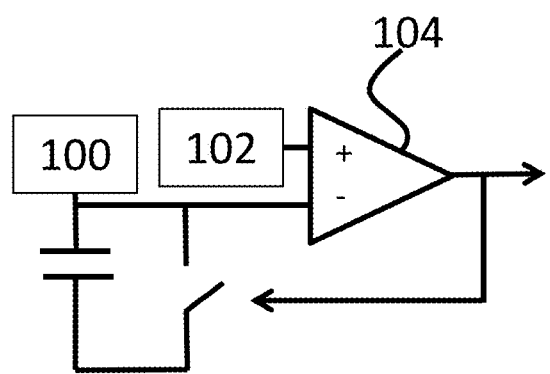
FIG. 1 is a block diagram illustrating a prior art readout integrated circuit.

Now regarding the present disclosure, where design requirements dictate true snapshot integration, i.e. integration across all detectors simultaneously, a digital pixel solution incorporating circuitry such as that shown in FIG. 1, which includes a detector current input 100, a threshold voltage 102 input to a comparator 104, and other enabling circuitry (e.g. integration capacitor(s) and transistors), can help to make this possible by reducing power and other requirements. Such solutions are insufficient, however, in high resolution, sensitivity, and frame rate applications.

Rolling subframe pulsed bias integration techniques and systems combined with digital pixel technology, in accordance with embodiments of the present disclosure, allow for a close approximation of true snapshot integration. In many cases, they also enable a single layer pixel solution, which is much less expensive to produce, compared to a dual layer design. This cost savings is true for both recurring and non-recurring cases. Furthermore, unlike dual layer designs, such techniques and systems can be implemented in very large area ROICs, using field stitching techniques. Such benefits result, in part, from allowing a relatively large ROIC pixel to operate a group of detectors and share components. This is made possible, in part, by having only one of the detectors in a given group integrating at a given time. While integration subframes are ordinarily used with subframe averager circuits for increased charge capacity, here they are used to spread out and interleave temporal response, lowering the subframe duty cycle and reducing peak integration currents, making them achievable on a ROIC.

Combining a shared cell with rolling subframe pulse bias integration techniques allows the shared pixels to overlap integrations, minimizing integration skew, the time difference for the average integration time, thereby enabling near true snapshot (i.e. simultaneous or global) integration. Shorter readout integration 200 times that result from the use of such techniques and systems also result in lower total power, total detector bias current, detector impedance, and integrated charge per detector while allowing higher ROIC input noise. These benefits allow for higher frame rates and resolutions.

Said another way, double speed frame rate operation of embodiments described herein is possible since the data rate is the same as for standard speed snapshot operation. More specifically, by operating in a rolling Integrate While Read (IWR) mode that allows integration and readout to overlap, the time available for readout is doubled, compared to the nominal 50% readout efficiency for standard rate operation.

Digital memory in the pixels of embodiments of the present disclosure, as shown in FIGS. 3-5 and 7, enables counter data to be saved after analog to digital conversion, allowing a resumption of use of the counter immediately while the data is being read out from the memory directly. In embodiments, digital memory also allows storage of partial coarse conversion data for all detectors, in embodiments 8 detectors, during rolling subframe integration. This configuration allows each detector to resume coarse conversion in subsequent subframes from where it left off previously after the other detectors have taken their turn at integrating subframes. At the end of frame integration, in embodiments, the coarse conversion data for all detectors is stored in the digital memory.

In embodiments, the same counter is used for coarse and fine conversion. In such embodiments, after coarse counting, the counter data is saved and the counter can then be used for fine conversion. Using the same counter for coarse and fine conversion significantly increases the dynamic range and improves the resolution of the pixel, all without requiring more counter circuits. Since counter circuits drive pixel size, this also enables smaller pixels. Furthermore, alternatives, such as a distributed Gray count, require many bus lines through the pixel and could have synchronization issues that the in-pixel counter disclosed herein avoids.

In embodiments, the in-pixel digital memory is Random Access Memory (RAM). In further embodiments, the RAM is Static Random Access Memory (SRAM). In-pixel SRAM provides integrate-while-read-operation capabilities, allowing for longer integration times, which increases pixel sensitivity. Longer readout times enabled by this configuration also allow slower data rates or fewer output lines. While analog pixels accomplished these functions with a single analog sample and hold, digital pixels require more area. The use of foundry library SRAM allows this same capability to be used for digital pixels.

Furthermore, the rolling subframe, multi-pulse bias architecture shown in FIGS. 3-5 and 7 allows shared circuits to form a pixel "supercell". This area savings allows a single wafer ROIC solution.

Figure 2A:
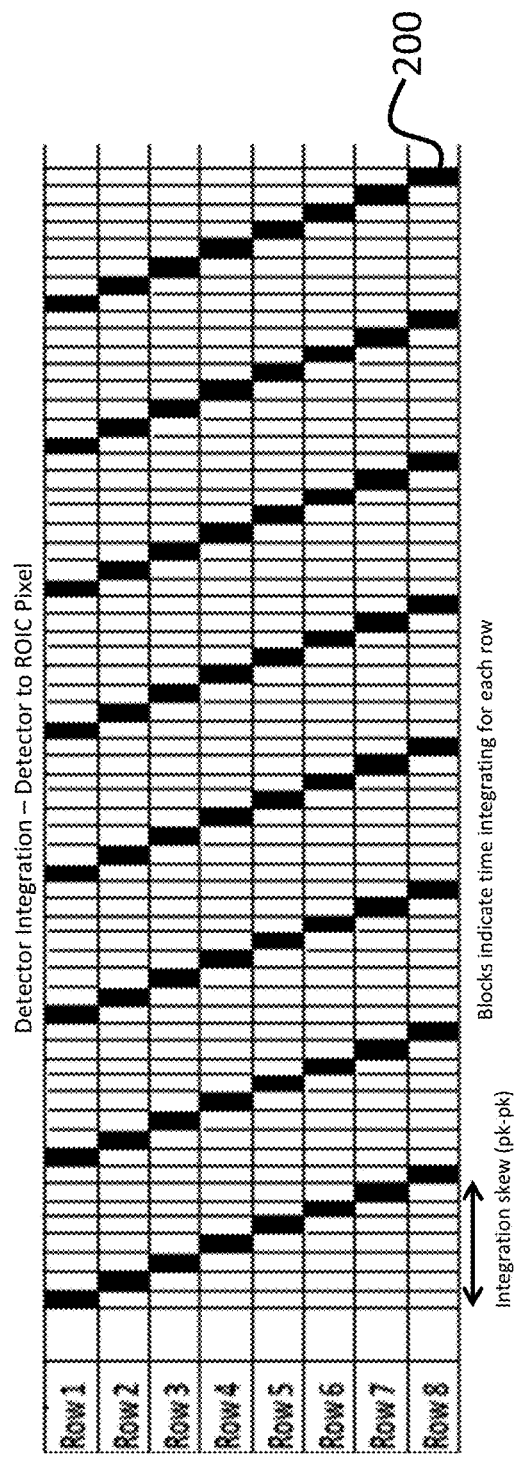
FIG. 2A is a chart describing a first half of a rolling subframe pulsed bias microbolometer integration scheme, in which the ROIC integrates the detector current, in accordance with embodiments of the present disclosure.

Now referring to FIG. 2A, a chart describing a first half of a frame that is readout and integrated using a rolling subframe pulsed bias microbolometer 312 integration scheme, in which a ROIC integrates the detector current, in accordance with embodiments of the present disclosure, is shown. In this figure, pixels are grouped into subsets, or rows, of 8, although embodiments may use more or fewer groupings without departing from the teachings of the present disclosure, dependent on the design goals. In the case of this exemplary embodiment, one microbolometer 312 from each group of 8 is integrated by the ROIC simultaneously, over a small fraction of the half of the frame dedicated to readout integration 200. After each pixel from a pixel group has been integrated by the ROIC, the process is repeated a number of times and the results of each integration summed to provide a total frame integration value. The precise number of pixels in a group and the number of subframes integrated and summed to provide a total frame integration value for a given pixel may vary, dependent on design goals and other considerations, and need not be the same. While this technique does not provide true snapshot integration, the integration skew, i.e. the time between beginning integration of a first pixel in a group of pixels and the beginning of integration of a last pixel in the same group of pixels, can be made a small fraction of the frame period, providing performance close to true snapshot integration without overburdening pixel and associated circuitry. Furthermore, since only 1 detector out of a group is ever integrating at one time, many components can be shared between pixels belonging to a given group.

Figure 2B:
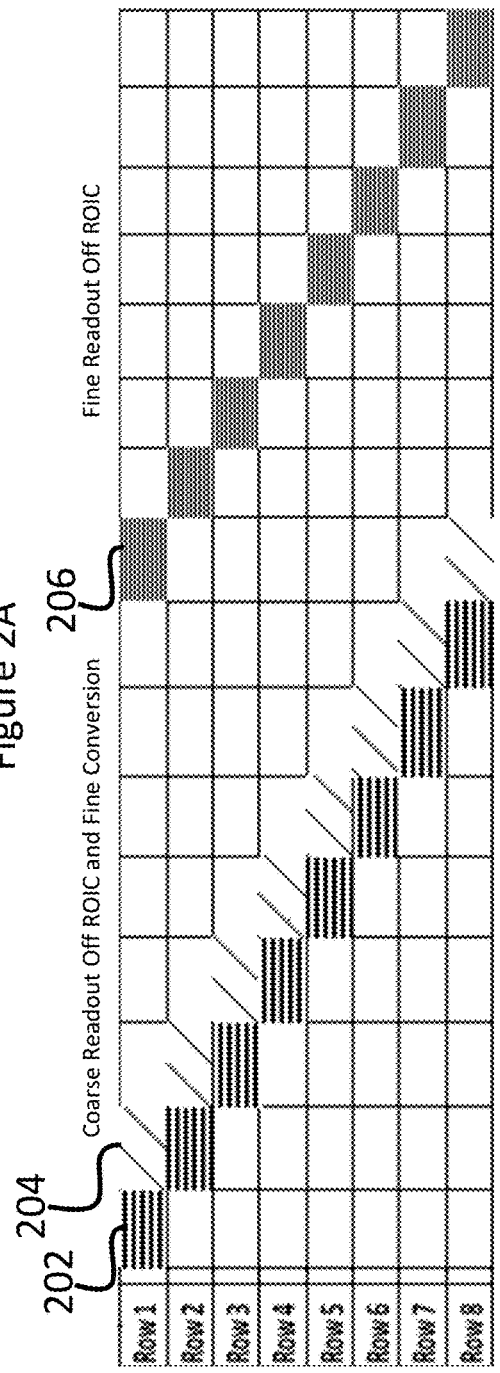
FIG. 2B is a chart describing a second half of a rolling subframe pulsed bias microbolometer integration scheme, in which integrated current is read off of a chip and fine conversion is performed, in accordance with embodiments of the present disclosure.

Now referring to FIG. 2B, FIG. 2B is a chart describing a second half of the rolling subframe pulsed bias microbolometer 312 integration scheme of FIG. 2A, in which integrated current is read off of the ROIC and, in embodiments implementing in-pixel two stage ADC, fine conversion 204 is performed, in accordance with embodiments of the present disclosure. FIG. 2B shows fine conversion 204 performed after readout of the coarse data 202 for each detector (in the exemplary embodiment depicted, in the group of 8 detectors). In embodiments that use the same memory for both conversions in the frame, which minimizes the amount of memory in the pixel, fine conversion 204 needs to take place after coarse readout 202, since it will rewrite the memory associated with each detector. Fine conversion 204 also requires a counter and so, if it is shared among the detectors (8, in the exemplary embodiment shown), as is the case in embodiments, the detectors (8, in the exemplary embodiment shown) need to take turns using it. Fine conversion 204 can take place any time between the readout of the coarse data 202 and the readout of the fine data 206 for a given detector. The order of readout and fine conversion 204 does not need to match the integration subframe order.

To summarize FIGS. 2A and 2B differently, instead of simultaneously integrating all detectors, perform a series of rolling subframe integrations, where each subframe is taken using only part of the array, and sum the subframes on the ROIC for each pixel. Because the subframes are spaced out across the integration time for all detectors, the integration skew across the FPA is small, effectively providing the benefits of true simultaneous integration. While providing results similar to those of true simultaneous integration, these techniques and methods result in lower FPA power requirements, easier bias requirements on ROIC, and lower detector impedance requirements, compared to true snapshot integration.

In one embodiment, where pixels are grouped into groups of eight (8), the half of the frame dedicated to detector integration is broken up into eight (8) subframes, and the frame rate is 120 Hz, integration skew is 456 µs, or 5% of the frame period, the total integration readout time is 521 µs and the individual pulse bias subframe times are 62 µs.

Figure 3:
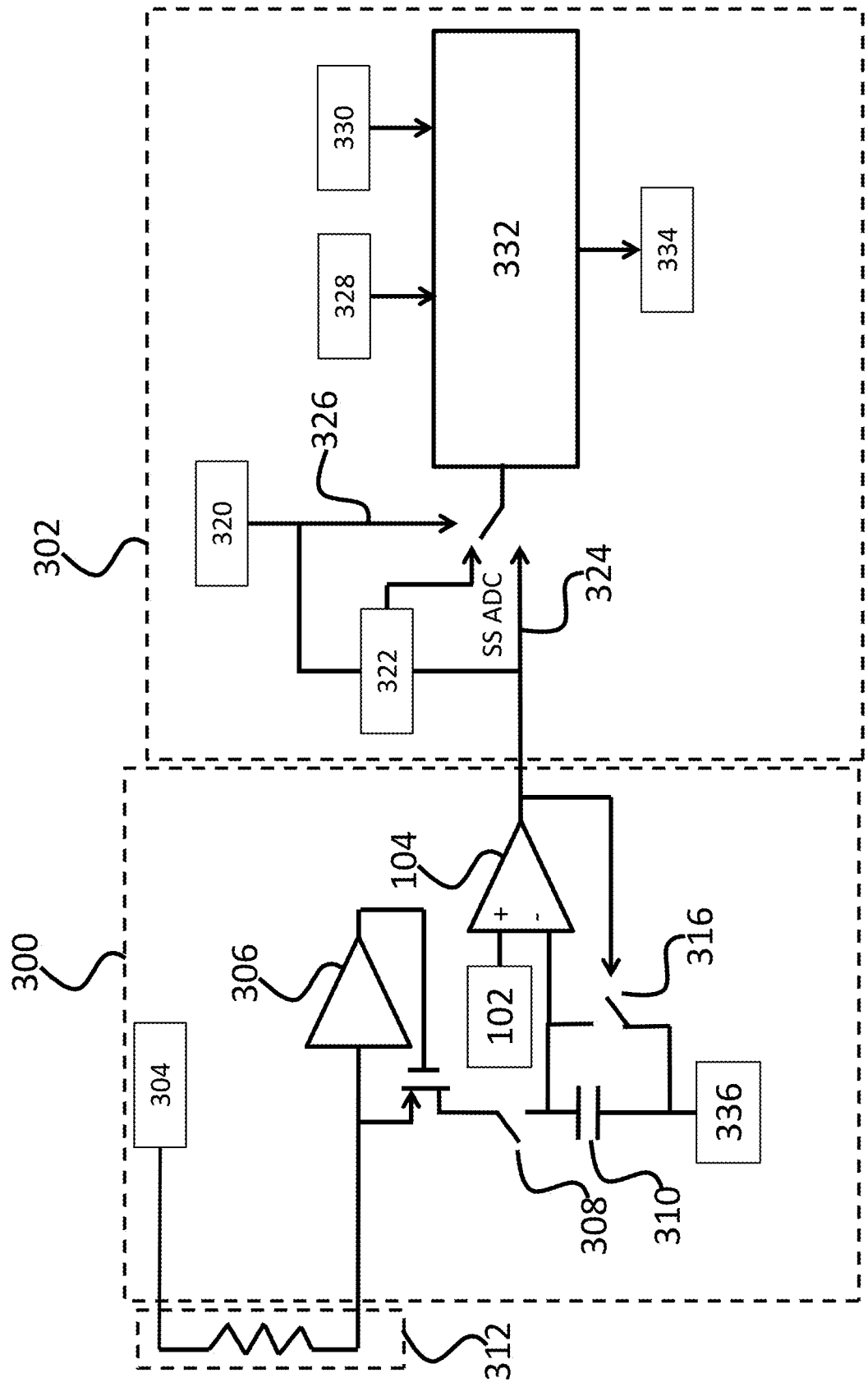
FIG. 3 is a schematic showing a digital IR pixel that uses a microbolometer as a detector with analog and digital portions thereof labeled, in accordance with embodiments of the present disclosure.

Now referring to FIG. 3, a schematic showing a ROIC that uses a microbolometer 312 as a detector with analog and digital portions thereof highlighted, in accordance with embodiments of the present disclosure, is shown. This embodiment shows a ROIC analog pixel 300 portion and a ROIC digital pixel 302 portion. The ROIC includes a microbolometer 312, a detector common 304, a BDI input with low noise bias amp 306, an integration stop switch 308, a readout integration 200 capacitor 310, a comparator 104 with threshold voltage input 102, a Voltage Reference/Ramp (VR) 336, which, in embodiments, is a divided voltage reference (VRSI) 336, an integration reset switch 316, a count reset connection 324, an enable count latch 322, a global clock 320, a readout connection 326, a data in bus 328, a count/shift bus 330, a counter/shift register 332, and a data out module 334.

Figure 4:
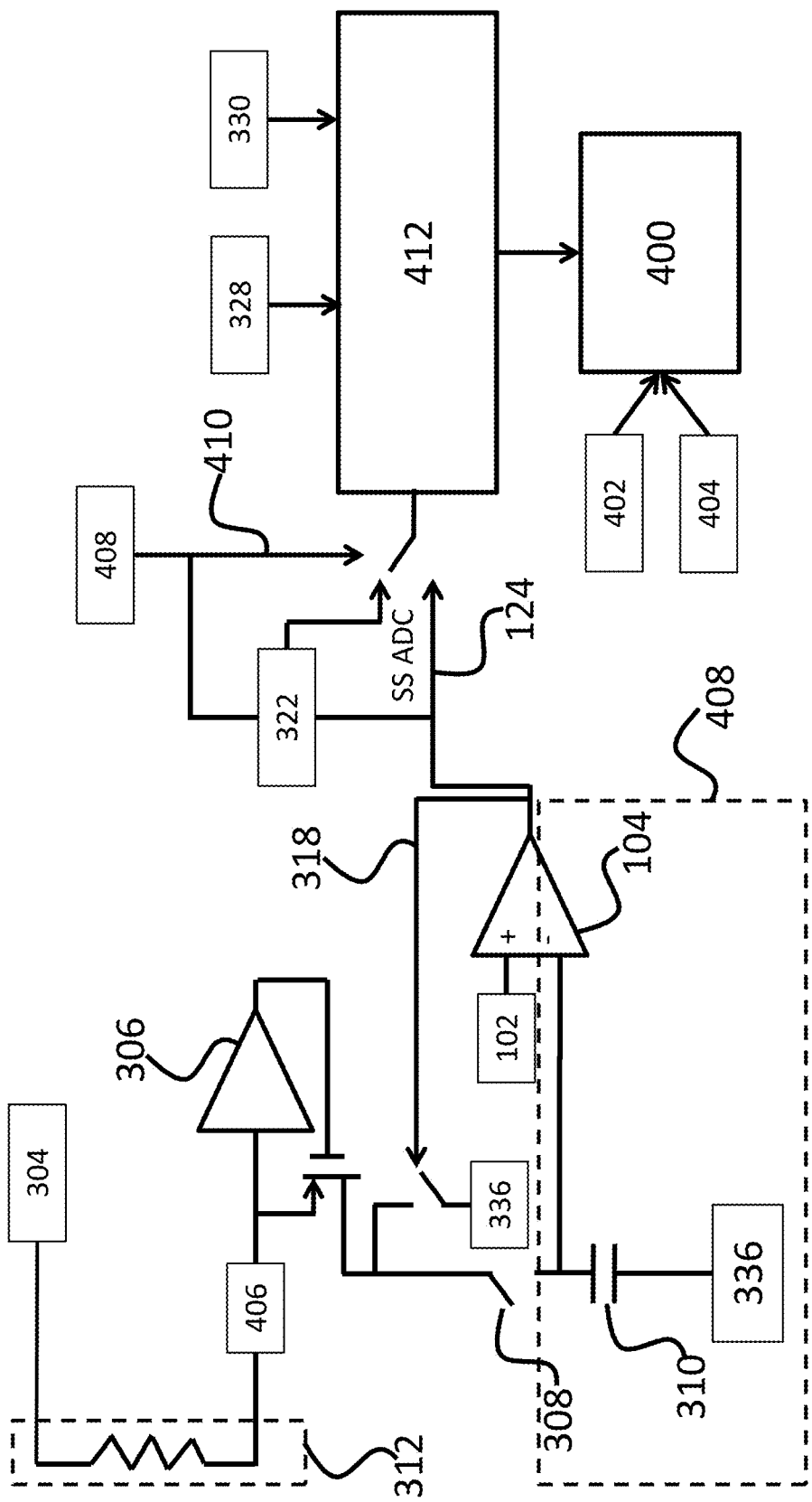
FIG. 4 is a schematic showing a digital IR pixel that uses a microbolometer as a detector that calls out portions of the circuitry required on each pixel, in accordance with embodiments of the present disclosure.

FIG. 4 discloses a variation on the ROIC of FIG. 3 that allows sharing of many components in the ROIC pixel between a group of detectors. In this embodiment, the readout connection 326 is replaced by a latch connection 410, and the counter/shift register 332 is replaced by a counter/latch 412, and the comparator 104 output is connected to VREF 336. Other differences include the connection of a latch module 400 having a select latch write 402 and select latch read 404 connected thereto to the counter/latch 412. The latch module 400 allows one counter 412 to be shared among the group of detectors. The latch module 400 contains latches with the same number of bits as the counter. The number of latches is equal to the number of shared detector pixels. In the exemplary embodiment discussed above, for example, there would be eight (8) 10-bit latches in the latch module 400.

The latch module 400 saves coarse count data from other detectors' previous subframes while the current detector is using the counter to count in the current subframe. At the end of the subframe for each detector, the counter value is stored in a latch for that detector and the count data for the next detector from previous subframes is loaded into the counter to continue the integration for that detector in the next subframe. Since latches are simpler than counters, this minimizes the number of devices needed in the pixel. Compact Static random access memory (SRAM) devices can be used for these latches that minimize layout area. Separate latches also allow coarse readout directly from the latches while the counter is used for fine conversion, so no separate time is needed for fine conversion beyond the normal readout time. This figure also includes the addition of a multiplexer 406 between the microbolometer 312 and bias amp 306, which is required in such embodiments for the sharing of circuits. Furthermore, this figure outlines the integration capacitor section of the circuit 408, which must be present for each pixel. Other components of the circuit that must be present in each pixel, i.e. they cannot be shared amongst pixels in a group of pixels, consist of the microbolometers 312 themselves, the latch module 400, comparator 104 inputs, which are part of the integration capacitance (although the comparator 104 itself can be shared), the integration stop switch 308, and the readout integration 200 capacitor 310. All other components may be shared in various embodiments.

Figure 5:
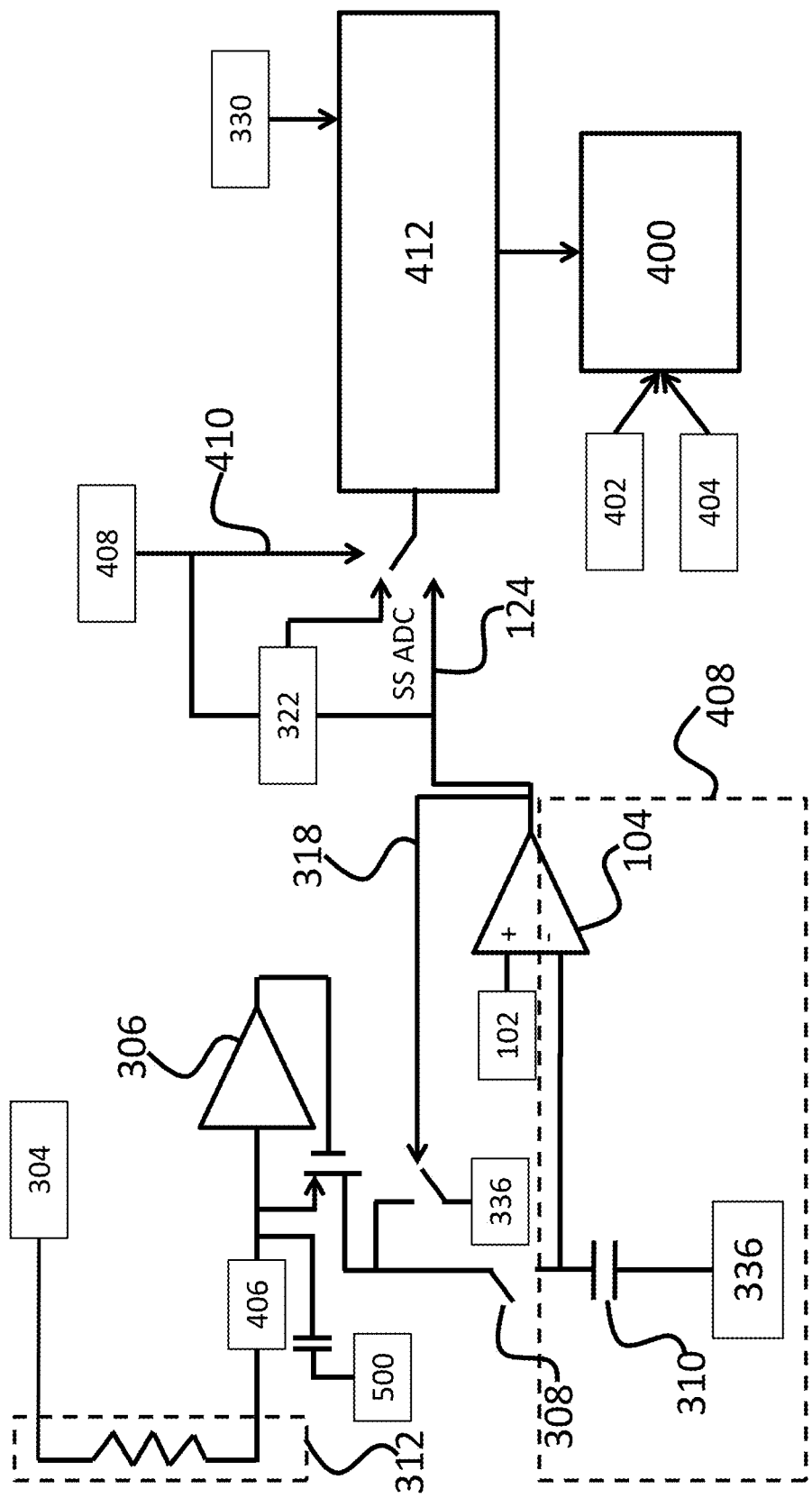
FIG. 5 is a schematic showing a digital IR pixel that uses a microbolometer as a detector that calls out portions of the circuitry required on each pixel and includes an additional fine conversion ramp, compared to the circuit shown in FIG. 4, in accordance with embodiments of the present disclosure.

Now referring to FIG. 5, FIG. 5 shows the circuit of FIG. 4 further comprising a fine conversion ramp 500. Multiple options exist for conversion of fine residue. In embodiments, single slope ADC is used, allowing the same counters to be used for coarse and fine conversion, assuming that they are done sequentially. This requires a conversion ramp in each pixel and would result in conversion being accomplished in a fixed time with fixed gain. FIGS. 3 and 4 supply the single slope conversion ramp using VREF 336, which is a DC voltage during integration and coarse conversion, but becomes a ramp for fine conversion. FIG. 5 introduces the ramp using a coupling capacitor connected to a voltage ramp input 500. This capacitor converts the voltage ramp into a constant current, which is integrated to fill the integration capacitor 310, tripping the comparator 104 to do the conversion. Such embodiments would require some calibration of at least offset, but integration time would be exact and conversion could be accomplished later.

In embodiments, a standard binary counter paired with latches may be used. In other embodiments, a charge pump "analog" Multi-Value Digital (MVD) counter could be used. Such an embodiment would support a die having a larger area, but would entail a considerably more complicated circuit and would likely slow readout.

In embodiments, an HDR pixel is used to perform sub-frame integration and summing of the microbolometer 312.

In embodiments, the digital pixel ROIC counts the number of well fills (coarse) and digitizes the residue at the end of integration (fine).

In embodiments, fine residue conversion uses single slope conversion in the pixel with the same comparator 104 and counter used for coarse conversion.

In embodiments, the coarse counter can roll over, thereby enhancing dynamic range.

Rolling subframe pulsed bias integration allows some variation in the FPA time constant for short time constants. If the detector time constant is less than the readout time, the readout time of the subframes can extend the time constant of the FPA beyond that of the detector, without having to increase the total readout integration time 200 per frame. Keeping total readout integration time 200 short can have advantages for microbolometer 312 sensitivity and power.

This is because microbolometer 312 sensitivity depends on the power input into the detector during readout, with a certain total energy level required for a specific performance level. Since shorter integration times have higher power per time and power is equal to $I^2R$, shorter integration times result in higher current, but only as the square root of the integration time. However, the time reduction is linear for less total electrons. A shorter integration time also has less total detector integrated current for the same sensitivity, for lower bias power and lower counting power. A higher current allows the use of a higher overall detector bias, reducing requirements on ROIC detector bias noise, which is a significant ROIC design driver. Higher bias current allows the use of a lower detector impedance while still providing a reasonable detector bias voltage, creating significant advantages to the detector and to the ROIC for shorter readout integration 200 times.

In embodiments, a microbolometer 312 photodetector is used in combination with such systems and methods the detector element of a digital pixel, providing improvements in frame rate and image resolution without a corresponding loss in FPA sensitivity, which would normally be expected where rolling subframe readout integration 200 techniques are used, as compared to continuous integration. This is because microbolometers 312 have the significant benefit of integrating IR radiation within their range of sensitivity without the use of further circuitry. This characteristic allows readout integration 200 (i.e. sampling of the microbolometer 312) to occur over a relatively short amount of time (e.g. fractions of a frame), with the remaining data being inferred based on the self-integration characteristics of the microbolometer 312.

Microbolometer 312 self-integration of photon flux incident thereon is a thermal integration that is due to the thermal mass of the detector itself. Specifically, the sensor temperature is measured at a first time, IR radiation is allowed to impact the detector, causing the temperature of the detector to rise, and, at a second time, the temperature is measured again (e.g. it is inferred by the predictable change in resistance of the microbolometer 312 over a given temperature range). Since the microbolometer 312 changes in temperature over the entire frame, measuring the resistance of each microbolometer 312 over very short timeframes and doing so multiple times per frame allows the photon flux incident on the detector between measurements to be inferred. The rate at which heat is conducted away from the microbolometer 312 is proportional to the time-constant of the detector.

By combining microbolometer 312 detectors, rolling subframe pulsed bias integration techniques, and two stage ADC techniques and associated circuitry, allows for many advantages. Advantages of this approach include a dynamic range limited only by the number of bits in a counter, not by process voltage range, allowing for counter rollover for automatic noiseless offset subtraction, and support for very fast frame rates, even for larger formats, due to the digital output from the pixel.

Figure 6:
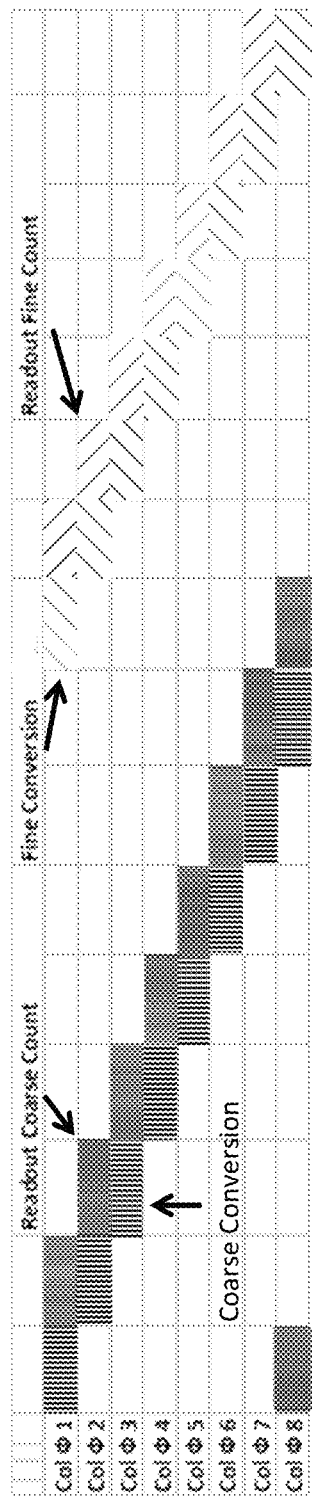
FIG. 6 is a chart describing a double frame rate rolling integrate while read timing method that provides for a rolling readout, in accordance with embodiments of the present disclosure.

Now referring to FIG. 6, FIG. 6 shows rolling IWR timing in accordance with embodiments of the present disclosure. In FIG. 6, coarse counting, fine counting, which, in embodiments, is performed using single slope conversion counting, and readout from the latches is depicted. In such embodiments, the detector integration is still only half of the frame since the other half provides for fine conversion. This rolling IWR mode does not have snapshot integration, i.e. simultaneous integration across all pixels of the Focal Plane Array (FPA), and the integration phasing would be within row groups, in the same pattern as the rolling subframe integration, except only once per frame.

Figure 7:
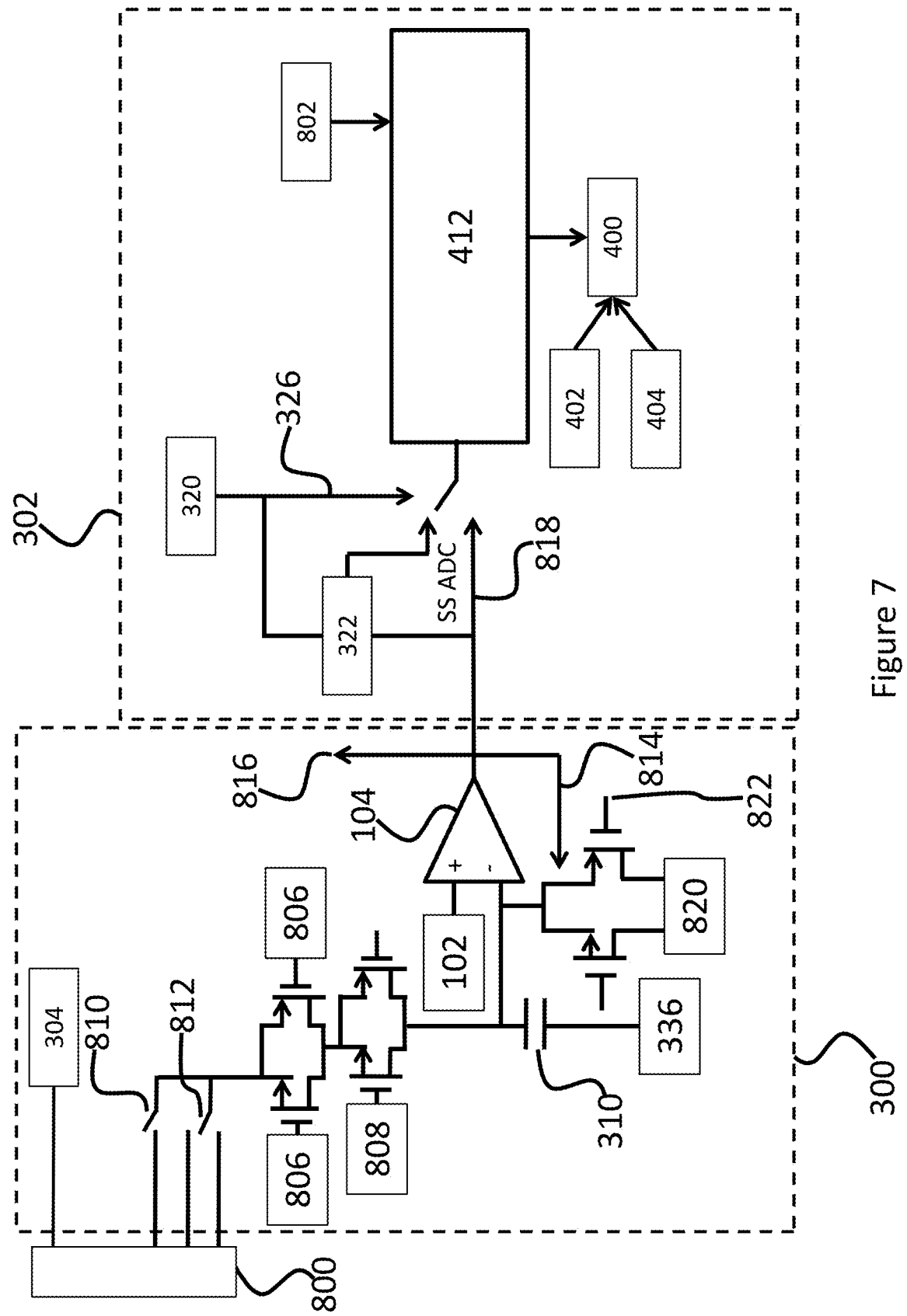
FIG. 7 is a schematic showing a pixel, in embodiments, a two color pixel, comprising a readout integrated circuit, in accordance with embodiments of the present disclosure.

Now referring to FIG. 7, a circuit similar to that shown in FIGS. 3 and 4, but using a typical photodetector in place of microbolometers is depicted. More specifically, FIG. 7 shows a ROIC with analog and digital portions thereof highlighted, in accordance with embodiments of the present disclosure. This embodiment shows a ROIC analog pixel 300 portion and a ROIC digital pixel 302 portion. The ROIC includes a photodetector 800, a detector common 304, a binning selection switch 810, a readout integration capacitor 310, a comparator 104 with threshold voltage input 102, a VRSI reference/ramp 336, an enable count latch 322, a global clock 320, a readout connection 326, a latch module 400 connected to a counter/latch 412, the latch module 400 having a select latch write 402 and select latch read 404 connected thereto, a counter reset 802, two integration bias transistors that are part of a bi-directional two color input circuit 806, a stop integration switch for residue conversion 808, a binning selection switch 810, an automatic reset 814, an event detect 816, a coarse counter reset 818, a reset reference voltage 820 or ADC conversion reference 820 (in embodiments, an event reference 820), and a global reset clock 822 or event bias 822.

In embodiments, the photodetector 800 is a two color photodetector.

In embodiments, the latch module 400 comprises SRAM.

In embodiments, the direct injection integration bias transistors 806 are one NFET and one PFET, allowing for integrating detector currents of either polarity. For bias-selectable two color detectors that have a single connection per pixel, the biasing of these input transistors and the DCOM voltage selects the detector bias and therefore which color is detected. The bi-directional input also allows use of either voltage polarity of single color detectors, since most photodetectors requires a specific polarity of bias and they are not all the same.

In embodiments, the ROIC comprises a select detector 812, allowing for parallel, two-color conversion. Some two color detectors have two connections per pixel. These switches allow selection between the two detector connections, whether they are of the same or different polarities.

In embodiments, many components in the ROIC pixel shown in FIG. 7 are shared between a group or groups of photo detectors 800. Switch 810 is used to allow multiple detectors to integrate in one ROIC input, often referred to as binning. The other ROIC inputs associated with the binned detectors can be unused or used for other functions.

In embodiments, the latch module 400 allows one counter 412 to be shared among the group of detectors.

In embodiments, the latch module 400 contains latches with the same number of bits as the counter 412. The number of latches in such embodiments is equal to the number of shared detector pixels.

In embodiments, the latch module 400 saves coarse count data from other detectors' previous subframes while the current detector is using the counter to count in the current subframe. At the end of the subframe for each detector, the counter value is stored in a latch for that detector and the count data for the next detector from previous subframes is loaded into the counter 412 to continue the integration for that detector in the next subframe. Since latches are simpler than counters 412, this minimizes the number of devices needed in the pixel. Compact Static random access memory (SRAM) devices can be used for these latches that minimize layout area. Separate latches also allow coarse readout directly from the latches while the counter 412 is used for fine conversion, so no separate time is needed for fine conversion beyond the normal readout time.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

What is claimed is:

1. An imaging apparatus comprising:
a focal plane array, said focal plan array comprising:
a plurality of pixels, wherein said pixels are arranged into groups of equal numbers of one or more pixels, each pixel comprising:
a photodetector configured to receive electromagnetic energy; and
a readout integrated circuit comprising an analog portion and a digital portion, the digital portion comprising at least one latch comprising random access memory,
wherein the readout integrated circuit comprises at least two direct injection integration bias transistors; and
wherein the readout integrated circuit is configured to perform analog to digital conversion.

2. The imaging apparatus of claim 1 wherein the random access memory is static random access memory.

3. The imaging apparatus of claim 1 wherein the random access memory comprises at least one foundry-generated memory cell, static random access memory, or dynamic random access memory, and wherein the memory cell is configured for dedicated access.

4. The imaging apparatus of claim 2 wherein said static random access memory is configured to act as a digital sample and hold.

5. The imaging apparatus of claim 1 wherein the readout integrated circuit of each group of pixels further comprises:
a binning selection switch connected between a first output of the photodetector and the digital portion of the readout integrated circuit;
a readout integration capacitor configured to convert charge produced by the photodetector to a voltage, wherein the readout integration capacitor is in electrical communication with a VRSI reference or ramp;
a comparator with two inputs, a threshold voltage input and a second input in electrical communication with the readout integration capacitor;
an enable count latch in electrical communication with an output of the comparator and in further electrical communication with a clock that itself is in switched electrical communication with a counter or latch via a readout connection, the enable count latch also being in switched electrical communication with the counter or latch;
a latch module connected to the counter or latch;
a select latch write in operative communication with the latch module;
a select latch read in operative communication with the latch module;
a counter reset in operative communication with the counter or latch;
at least two direct injection integration bias transistors disposed between the comparator and the photodetector;
a stop integration switch configured for residue conversion and disposed between the comparator and the photodetector;
an event detect connected to the comparator output;
and a reset clock or event bias disposed between the comparator output and the second input of the comparator.

6. The imaging apparatus of claim 1 wherein said readout integrated circuit is configured to perform in-pixel single slope analog to digital conversion.

7. The imaging apparatus of claim 1 wherein said readout integrated circuit is configured to perform in-pixel two-stage analog to digital conversion.

8. The imaging apparatus of claim 1 wherein said photodetector is a two-color photodetector.

9. The imaging apparatus of claim 8 wherein the readout integrated circuit further comprises a select detector configured to allow parallel, two-color conversion.

10. The imaging apparatus of claim 1 wherein the at least two direct injection integration bias transistors are one NFET and one PFET.

11. The imaging apparatus of claim 1 wherein the latch is configured to allow one counter to be shared among a group of pixels.

12. The imaging apparatus of claim 11 wherein the latch is configured to store coarse count data corresponding to a previously-captured subframe from at least one photodetector while a different photodetector is using the counter to count a subframe in the process of being captured and then, for each photodetector, to load a counter value stored in the latch for that detector and the count data for the next detector from previous subframes to continue the integration for that detector in the next subframe.

13. The imaging apparatus of claim 1 wherein the latch comprises a plurality of latches, each latch having the same number of bits as the counter shared among the group of pixels.

14. The imaging apparatus of claim 13 wherein the number of latches is equal to the number of pixels in the group of pixels.

15. An imaging apparatus comprising:
- a plurality of groups of pixels, each group comprising at least one pixel;
- wherein each pixel comprises a photodetector,
- wherein each pixel in a group of pixels shares a plurality of components with other pixels in said group of pixels,
- wherein each of said groups of pixels is configured to perform in-pixel analog to digital conversion of electromagnetic energy collected by said photodetectors within that group of pixels using circuitry common to said group of pixels;
- wherein the circuitry common to said group of pixels comprises at least two direct injection integration bias transistors; and
- wherein each of said groups of pixels comprises random access memory.

16. The imaging apparatus of claim 15 wherein said static random access memory is configured to act as a digital sample and hold.

17. The imaging apparatus of claim 16 wherein said circuitry common to said group of pixels comprises a readout integrated circuit.

18. The imaging apparatus of claim 17 wherein said readout integrated circuit comprises at least one latch, the latch being in operative communication with at least one select latch write and at least one select latch read, and wherein said latch module comprises static random access memory and is in operative communication with a counter.

19. The imaging apparatus of claim 18 wherein said readout integrated circuit is configured to perform in-pixel single slope ADC.

* * * * *